(12) United States Patent
Saito et al.

(10) Patent No.: US 8,928,039 B2
(45) Date of Patent: *Jan. 6, 2015

(54) SEMICONDUCTOR DEVICE INCLUDING HETEROJUNCTION FIELD EFFECT TRANSISTOR AND SCHOTTKY BARRIER DIODE

(71) Applicant: Kabushiki Kaisha Toshiba, Tokyo (JP)

(72) Inventors: Wataru Saito, Hyogo (JP); Yasunobu Saito, Tokyo (JP); Hidetoshi Fujimoto, Kanagawa (JP); Akira Yoshioka, Kanagawa (JP); Tetsuya Ohno, Kanagawa (JP); Toshiyuki Naka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/048,480

(22) Filed: Oct. 8, 2013

(65) Prior Publication Data

US 2014/0035004 A1    Feb. 6, 2014

Related U.S. Application Data

(63) Continuation of application No. 13/599,951, filed on Aug. 30, 2012, now Pat. No. 8,581,301.

(30) Foreign Application Priority Data

Mar. 23, 2012 (JP) ................. 2012-068143

(51) Int. Cl.
*H01L 21/02* (2006.01)
*H01L 27/07* (2006.01)
(Continued)

(52) U.S. Cl.
CPC ........ *H01L 27/0727* (2013.01); *H01L 29/7786* (2013.01); *H01L 29/872* (2013.01);
(Continued)

(58) Field of Classification Search
CPC .......... H01L 29/0619; H01L 27/0266; H02M 3/155; H02M 2001/007
USPC ............ 257/195, E29.246, E33.058; 438/172
See application file for complete search history.

(56) References Cited

U.S. PATENT DOCUMENTS 6,222,266 B1    4/2001   Kohno
6,933,544 B2    8/2005   Saito et al.
(Continued)

FOREIGN PATENT DOCUMENTS

JP    H11103051 A    4/1999
JP    2003229566 A   8/2003
(Continued)

OTHER PUBLICATIONS

Japanese Office Action dated May 27, 2014, filed in Japanese counterpart Application No. 2012-068143, 6 pages (with translation).

*Primary Examiner* — Thao X Le
*Assistant Examiner* — Patricia Reddington
(74) *Attorney, Agent, or Firm* — Patterson & Sheridan, LLP

(57) ABSTRACT

According to one embodiment, a semiconductor device has a first nitride semiconductor layer, a second nitride semiconductor layer provided on the first nitride semiconductor layer and formed of a non-doped or n-type nitride semiconductor having a band gap wider than that of the first nitride semiconductor layer, a heterojunction field effect transistor having a source electrode, a drain electrode, and a gate electrode, a Schottky barrier diode having an anode electrode and a cathode electrode, and first and second element isolation insulating layers. The first element isolation insulating layer has a first end contacting with the drain electrode and the anode electrode, and a second end located in the first nitride semiconductor layer. The second element isolation insulating layer has a third end contacting with the cathode electrode, and a fourth end located in the first nitride semiconductor layer.

20 Claims, 13 Drawing Sheets

(51) Int. Cl.
  *H01L 29/778* (2006.01)
  *H01L 29/872* (2006.01)
  *H01L 21/8252* (2006.01)
  *H01L 27/06* (2006.01)
  *H01L 29/417* (2006.01)
  *H01L 29/06* (2006.01)
  *H01L 29/10* (2006.01)
  *H01L 29/20* (2006.01)
  *H02M 3/155* (2006.01)
  *H02M 3/335* (2006.01)
  *H02M 1/00* (2006.01)

(52) U.S. Cl.
  CPC ....... *H01L 21/8252* (2013.01); *H01L 27/0605* (2013.01); *H01L 27/0629* (2013.01); *H01L 29/41758* (2013.01); *H01L 29/0619* (2013.01); *H01L 29/1066* (2013.01); *H01L 29/2003* (2013.01); *H02M 3/155* (2013.01); *H02M 3/33569* (2013.01); *H02M 2001/007* (2013.01)
  USPC .................... 257/196; 257/E29.246; 438/172

(56) References Cited

U.S. PATENT DOCUMENTS

| | | | |
|---|---|---|---|
| 7,838,907 B2 | 11/2010 | Shiraishi | |
| 7,884,395 B2 | 2/2011 | Saito | |
| 7,982,240 B2 | 7/2011 | Machida | |
| 7,999,289 B2 | 8/2011 | Suzuki et al. | |
| 8,227,810 B2 | 7/2012 | Okada et al. | |
| 8,390,091 B2 | 3/2013 | Renaud | |
| 8,581,301 B2 * | 11/2013 | Saito et al. | 257/195 |
| 2004/0188758 A1 | 9/2004 | Inoue et al. | |
| 2005/0110042 A1 | 5/2005 | Saito et al. | |
| 2005/0274977 A1 | 12/2005 | Saito et al. | |
| 2006/0081897 A1 | 4/2006 | Yoshida | |
| 2006/0131619 A1 | 6/2006 | Wu | |
| 2007/0210430 A1 | 9/2007 | Kagii et al. | |
| 2007/0228422 A1 | 10/2007 | Suzuki et al. | |
| 2007/0228477 A1 | 10/2007 | Suzuki et al. | |
| 2008/0315257 A1 | 12/2008 | Shiraishi | |
| 2009/0008679 A1 | 1/2009 | Saito | |
| 2009/0166677 A1 | 7/2009 | Shibata et al. | |
| 2009/0206363 A1 | 8/2009 | Machida et al. | |
| 2010/0155781 A1 | 6/2010 | Suzuki et al. | |
| 2010/0244050 A1 | 9/2010 | Kuraguchi | |
| 2010/0301491 A1 | 12/2010 | Yang | |
| 2011/0073938 A1 | 3/2011 | Takahashi | |
| 2011/0193171 A1 | 8/2011 | Yamagiwa et al. | |
| 2011/0204381 A1 | 8/2011 | Okada et al. | |
| 2011/0260777 A1 | 10/2011 | Suzuki et al. | |
| 2012/0145995 A1 | 6/2012 | Jeon et al. | |
| 2012/0217542 A1 | 8/2012 | Morita | |
| 2012/0267637 A1 | 10/2012 | Jeon et al. | |

FOREIGN PATENT DOCUMENTS

| | | |
|---|---|---|
| JP | 2005149761 A | 6/2005 |
| JP | 2006100645 A | 4/2006 |
| JP | 2006513580 A | 4/2006 |
| JP | 2007273795 A | 10/2007 |
| JP | 4190931 B2 | 9/2008 |
| JP | 2009004398 A | 1/2009 |
| JP | 2009009993 A | 1/2009 |
| JP | 2009164158 A | 7/2009 |
| JP | 2010225962 A | 10/2010 |
| JP | 2011035072 A | 2/2011 |
| JP | 2011135094 A | 7/2011 |
| WO | 2011064955 A1 | 6/2011 |

* cited by examiner

US 8,928,039 B2

SEMICONDUCTOR DEVICE INCLUDING HETEROJUNCTION FIELD EFFECT TRANSISTOR AND SCHOTTKY BARRIER DIODE

CROSS-REFERENCE TO RELATED APPLICATION

This application is a continuation of U.S. patent application Ser. No. 13/599,951, filed on Aug. 30, 2012, which is based upon and claims the benefit of priority from prior Japanese Patent Application No. 2012-68143, filed on Mar. 23, 2012, the entire contents of which are incorporated herein by reference.

FIELD

Embodiments of the present invention relate to a semiconductor device.

BACKGROUND

A power semiconductor device such as a switching device and a diode is used in a power converter circuit such as a switching supply and an inverter. The power semiconductor device is required to have high breakdown voltage and a low ON-resistance. There is a trade-off relationship between the breakdown voltage and the ON-resistance, depending on device material. In a power semiconductor device using silicon as a main device material, a marginal low ON-resistance has been realized by the progress of technical development up to now.

In order to further reduce the ON-resistance of a power semiconductor device, a device material is required to be changed. Thus, a wide-band gap semiconductor including a nitride semiconductor such as gallium nitride (GaN), aluminum gallium nitride (AlGaN), or silicon carbide (SiC) is used as a switching device material. According to this constitution, a trade-off relationship determined by a material can be improved, and the ON-resistance can be dramatically reduced.

Among devices using a nitride semiconductor such as GaN and AlGaN, as a device in which a low ON-resistance is easily obtained, there is a heterojunction field effect transistor (HFET: Hetero-structure Field Effect Transistor) using an AlGaN/GaN hetero-structure. The HFET realizes the low ON-resistance by utilizing, as a channel, high-mobility and highly-concentrated two-dimensional electron gas (2DEG) generated on an AlGaN/GaN hetero-interface by a piezoelectric polarization. Consequently, a device with a small chip area but a low ON-resistance can be obtained. Since a device capacity is reduced due to the small chip area, a device suitable for high-speed switching operation can be obtained.

However, in fact, when HFET is switched at high speed, switching noise due to a surge voltage/current according to a parasitic inductance is easily generated. When the switching noise is propagated to a gate line, there occur problems such as occurrence of loss and destruction of a device due to malfunction of the HFET.

DETAILED DESCRIPTION

Figure 1:
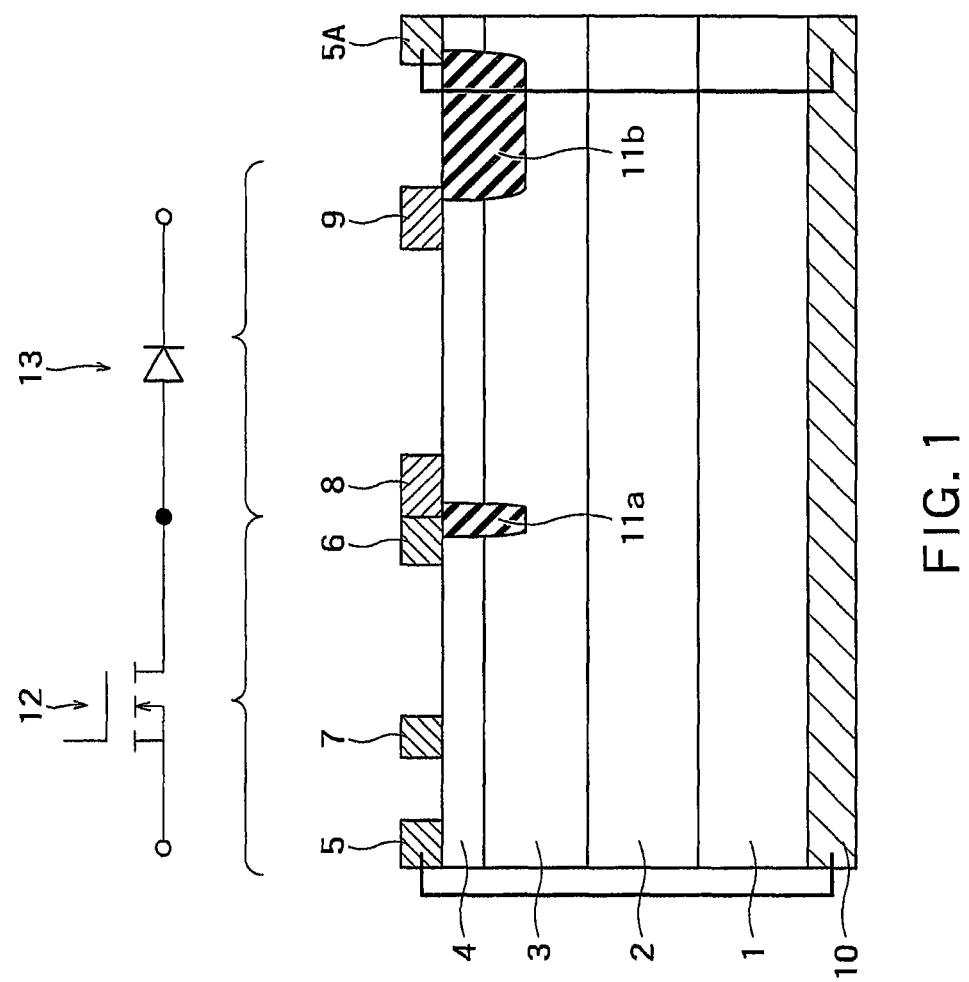
FIG. 1 is a schematic cross-sectional view of a nitride semiconductor device according to a first embodiment of the present invention.

In one embodiment, a semiconductor device includes: a first nitride semiconductor layer; a second nitride semiconductor layer provided on the first nitride semiconductor layer and including a non-doped or n-type nitride semiconductor having a band gap wider than that of the first nitride semiconductor layer; a first heterojunction field effect transistor having a first source electrode provided on the second nitride semiconductor layer and forming an electric connection with the second nitride semiconductor layer, a first drain electrode provided on the second nitride semiconductor layer and forming an electric connection with the second nitride semiconductor layer, and a first gate electrode provided between the first source electrode and the first drain electrode; a first Schottky barrier diode having a first anode electrode provided on the second nitride semiconductor layer, forming an electric connection with the second nitride semiconductor layer; a first element isolation insulating layer having a first end contacting with the first drain electrode and the first anode electrode, and a second end located in the first nitride semiconductor layer; and a second element isolation insulating layer having a third end contacting with the first cathode electrode, and a fourth end located in the first nitride semiconductor layer.

Hereinafter, a nitride semiconductor device according to embodiments of the present invention will be described with reference to the drawings. In each drawing, components having equivalent functions are assigned the same reference numerals, and detailed descriptions of the components assigned the same reference numerals are not repeated.

(First Embodiment)

Figure 2:
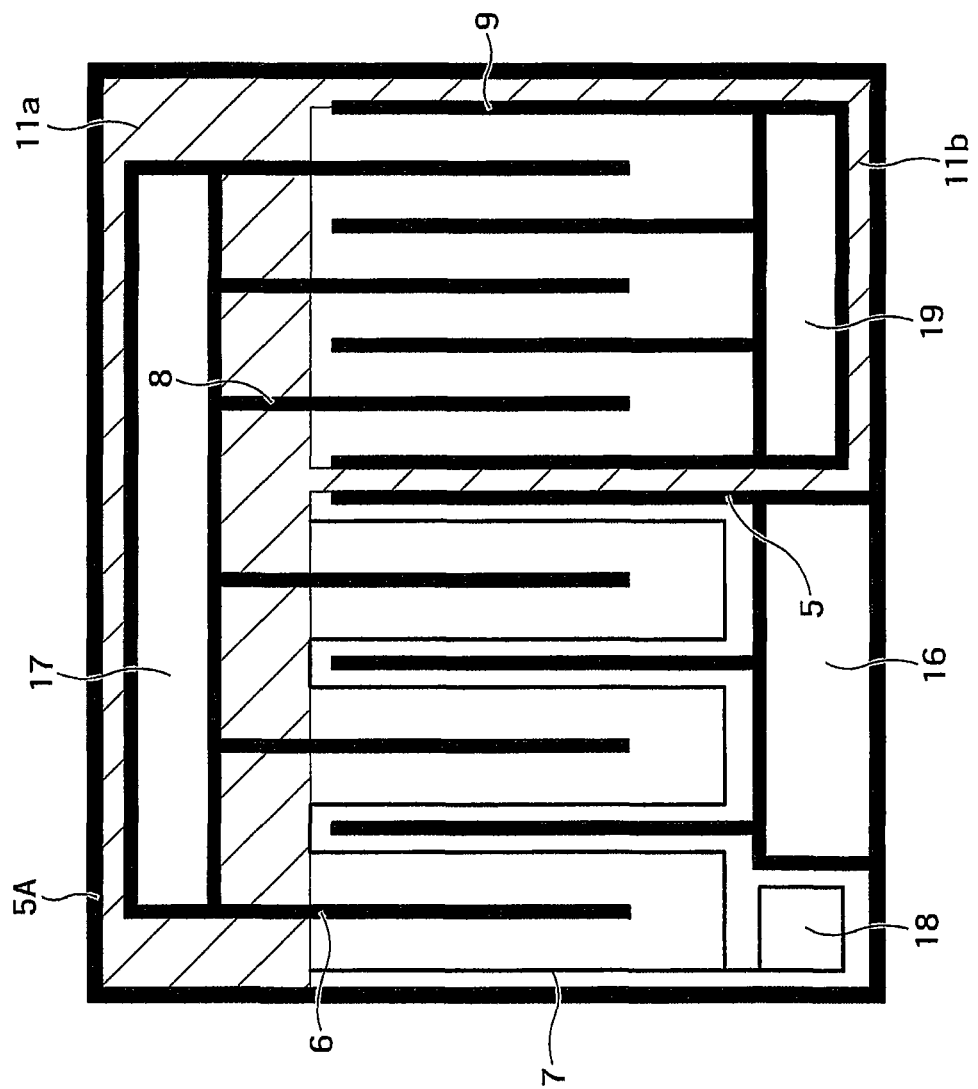
FIG. 2 is a plan view showing arrangement of electrodes of the nitride semiconductor device according to the first embodiment of the present invention.

A nitride semiconductor device according to a first embodiment of the present invention will be described with reference to FIGS. 1 and 2. FIG. 1 is a schematic cross-sectional view of the nitride semiconductor device according to the first embodiment. FIG. 2 is a plan view showing arrangement of electrodes of the nitride semiconductor device.

The nitride semiconductor device according to the present embodiment is provided with an electroconductive substrate 1, a buffer layer 2, a nitride semiconductor layer 3, a nitride semiconductor layer 4, a source electrode 5, a drain electrode 6, a gate electrode 7, an anode electrode 8, a cathode electrode 9, a back surface electrode 10, element isolation insulating layers 11a and 11b, and a frame electrode 5A.

As shown in FIG. 1, the nitride semiconductor layer 3 to be a channel layer is formed on the electroconductive substrate 1 through the buffer layer 2, and the nitride semiconductor layer 4 to be a barrier layer is formed on the nitride semiconductor layer 3. Moreover, the source electrode 5, the drain electrode 6, and the gate electrode 7 of an HFET (heterojunction field effect transistor) 12 as well as the anode electrode 8 and the cathode electrode 9 of an SBD (Schottky barrier diode) 13 are formed on the nitride semiconductor layer 4.

Hereinafter, the above components will be described in detail.

The electroconductive substrate 1 is a substrate having electrical conductivity. Although the electroconductive substrate 1 is a p-type Si substrate, for example, the conductivity type and the substrate material are not limited thereto. Namely, the conductivity type of the electroconductive substrate 1 may be n-type, and other material such as SiC may be used as the substrate material.

The buffer layer 2 is provided for stacking a high-quality nitride semiconductor layer on an upper surface of the electroconductive substrate 1. Although the buffer layer 2 is formed of AlGaN, for example, the constitution is not limited thereto. The buffer layer 2 may be of a multilayer structure (such as AlGaN/GaN and AlN/GaN) in which thin layers of plural kinds of nitride semiconductors are alternately stacked.

The nitride semiconductor layer (channel layer) 3 is provided on the buffer layer 2 and formed of non-doped $Al_xGa_{1-x}N$ ($0 \leq X < 1$). The nitride semiconductor layer 3 may be provided directly on the electroconductive substrate 1 not through the buffer layer 2.

The nitride semiconductor layer (barrier layer) 4 is formed on the nitride semiconductor layer 3. The nitride semiconductor layer 4 is formed of a nitride semiconductor having a band gap wider than that of the nitride semiconductor layer 3 and formed of, for example, $Al_YGa_{1-Y}N$ ($0 < Y \leq 1$, $X < Y$).

Even when the nitride semiconductor layer 4 is formed of a non-doped nitride semiconductor, highly-concentrated two-dimensional electron gas is generated on an interface between the nitride semiconductor layer 3 and the nitride semiconductor layer 4 by a piezoelectric polarization. However, the nitride semiconductor layer 4 may not necessarily be formed of the non-doped nitride semiconductor and may be formed of an n-type nitride semiconductor.

A combination of the material of the nitride semiconductor layer 4 to be the barrier layer and the material of the nitride semiconductor layer 3 to be the channel layer is not limited to a combination of AlGaN/GaN-based material, and other combination such as GaN/InGaN-based material, AlN/AlGaN-based material, and InAlN/GaN-based material may be employed.

The source electrode 5 and the drain electrode 6 are provided on the nitride semiconductor layer 4 and form an ohmic connection with the nitride semiconductor layer 4.

As shown in FIG. 2, a plurality of the source electrodes 5 and a plurality of the drain electrodes 6 are alternately provided along a predetermined direction (vertical direction in FIG. 2). The respective ends of the source electrodes 5 are connected to a source electrode pad 16. The respective ends of the drain electrodes 6 are connected to a drain electrode/anode electrode pad 17.

The gate electrode 7 is provided between the source electrode 5 and the drain electrode 6, and controls the concentration of the two-dimensional electron gas generated on the interface between the nitride semiconductor layer 3 and the nitride semiconductor layer 4. As shown in FIG. 2, the gate electrode 7 is provided between the source electrode 5 and the drain electrode 6 in a zigzag manner along the source electrodes, and one end of the gate electrode 7 is connected to a gate electrode pad 18. In the present embodiment, the gate electrode 7 is provided on the nitride semiconductor layer 4 and forms a Schottky connection with the nitride semiconductor layer 4.

The structure of the gate electrode 7 is not limited to a Schottky gate structure, and a so-called insulated gate structure may be adopted. In this case, the gate electrode 7 is provided on an insulating layer formed on the nitride semiconductor layer 4. As described in detail in the first variation of the present embodiment, a p-type nitride semiconductor layer may be interposed between the gate electrode 7 and the nitride semiconductor layer 4.

The anode electrode 8 is provided on the nitride semiconductor layer 4 and forms a Schottky connection with the nitride semiconductor layer 4. The anode electrode 8 is electrically connected to the drain electrode 6. In the present embodiment, as shown in FIG. 2, the drain electrode 6 and the anode electrode 8 are electrically connected to each other through the drain electrode/anode electrode pad 17.

The cathode electrode 9 is provided on the nitride semiconductor layer 4 and forms an ohmic connection with the nitride semiconductor layer 4.

As shown in FIG. 2, a plurality of the anode electrodes 8 and a plurality of the cathode electrodes 9 are alternately provided along a predetermined direction. The respective ends of the anode electrodes 8 are connected to the drain electrode/anode electrode pad 17. The respective ends of the cathode electrodes 9 are connected to a cathode electrode pad 19.

As shown in FIG. 2, the frame electrode 5A is a frame-shaped electrode surrounding outer peripheries of the HFET 12 and the SBD 13. The frame electrode 5A is provided so as to surround the outer peripheries of the HFET 12 and the SBD 13, including the above-mentioned electrode pads 16 to 19.

As shown in FIG. 2, the frame electrode 5A is provided on the nitride semiconductor layer 4 and electrically connected to the source electrode 5. Further, as shown in FIG. 1, the frame electrode 5A is electrically connected to the electroconductive substrate 1.

The frame electrode 5A and the electroconductive substrate 1 can be electrically connected by various means. As shown in FIG. 1, the back surface electrode 10 is provided on a lower surface of the electroconductive substrate 1 so as to form an ohmic connection with the electroconductive substrate 1. A chip of the nitride semiconductor device according to the present embodiment is solder-mounted to a package frame formed of metal such as copper (Cu), whereby the back surface electrode 10 is electrically connected to the package frame. Then, the frame electrode 5A is connected to the package frame with a bonding wire, whereby the frame electrode 5A and the electroconductive substrate 1 are electrically connected. Alternatively, the frame electrode 5A and the electroconductive substrate 1 may be electrically connected by a via (not illustrated) provided so as to penetrate through the nitride semiconductor layers 3 and 4.

As seen in FIGS. 1 and 2, the element isolation insulating layer 11a is provided from a surface of the nitride semiconductor layer 4 to an intermediate portion of the nitride semiconductor layer 3 between the drain electrode 6 and the anode electrode 8. As shown in FIG. 2, the element isolation insulating layer 11a is formed in a region including the drain electrode/anode electrode pad 17. According to this constitution, when a reverse voltage is applied to the SBD 13, a leak current is prevented from flowing from the drain electrode 6. Namely, a reverse leak current of the SBD 13 is prevented.

As seen in FIGS. 1 and 2, the element isolation insulating layer 10 is provided from the surface of the nitride semiconductor layer 4 to an intermediate portion of the nitride semiconductor layer 3 between the source electrode 5, the source electrode pad 16 and the frame electrode 5A, and the cathode electrode 9 and the cathode electrode pad 19. The element isolation insulating layer 11b is provided between the source electrode 5, the source electrode pad 16 and the frame electrode 5A, and the cathode electrode 9 and the cathode electrode pad 19, and insulates both sides.

The element isolation insulating layers 11a and 11b are not limited by their formation process and, for example, may be formed by performing ion injection in a predetermined region or a mesa may be formed in a predetermined region by etching.

Figure 3:
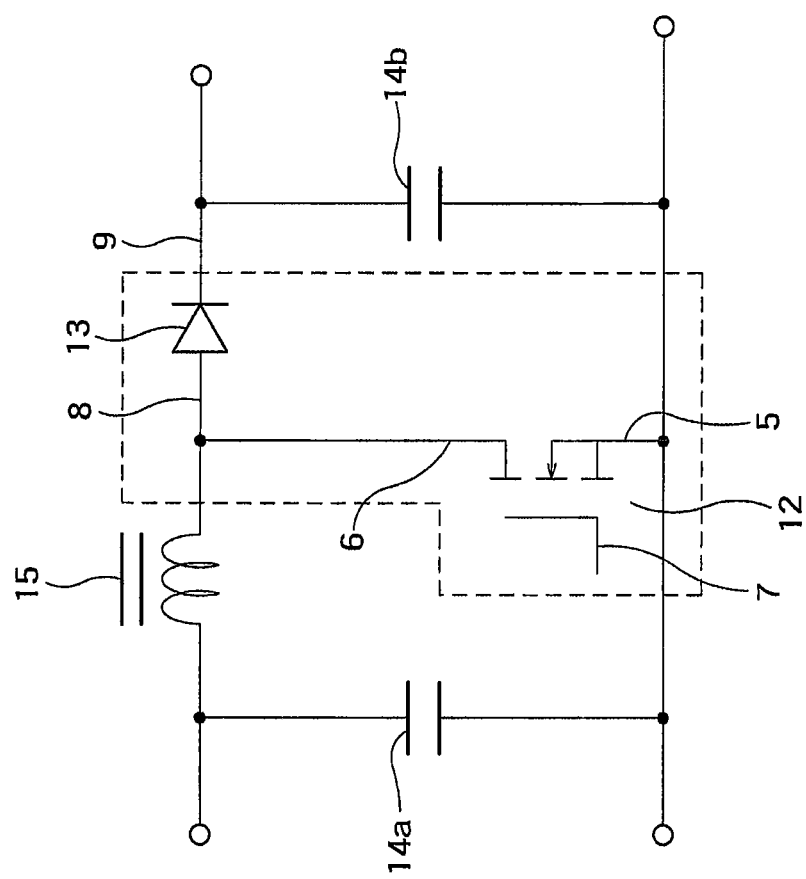
FIG. 3 is a circuit diagram of a boost chopper including the nitride semiconductor device according to the first embodiment of the present invention.

In the nitride semiconductor device according to the present embodiment, functionally, as shown in FIG. 1, the HFET 12 and the SBD 13 are connected in series so that the drain electrode 6 and the anode electrode 8 are connected. FIG. 3 shows a circuit diagram of a boost chopper including the nitride semiconductor device according to the present embodiment. As shown in FIG. 3, a boost chopper circuit includes the HFET 12, the SBD 13 connected in series to the HFET 12, capacitors 14a and 14b, and a choke coil 15. A portion surrounded by a dashed line in FIG. 3 is a portion which can be formed of the nitride semiconductor device according to the present embodiment.

As described above, in the present embodiment, the HFET 12 and the SBD 13 connected in series to the HFET 12 are integrated, whereby a parasitic inductance between the HFET 12 and the SBD 13 is reduced.

Further, in the present embodiment, the frame electrode 5A is provided so as to surround the outer peripheries of the HFET 12 and the SBD 13. The frame electrode 5A is electrically connected to the source electrode 5 as a ground line of a power converter circuit such as a boost chopper circuit. The frame electrode 5A is also electrically connected to the electroconductive substrate 1. According to this constitution, the parasitic inductance in the ground line is reduced.

As described above, according to the present embodiment, the parasitic inductance is reduced, whereby even if the HFET 12 is switching-operated at a high speed, the generation of switching noise can be suppressed as much as possible.

Further, in the present embodiment, the HFET 12 and the SBD 13 are shielded by the frame electrode 5A, whereby noise from outside can be blocked.

Thus, according to the present embodiment, the switching noise and noise from outside are suppressed as much as possible to prevent a malfunction of the device due to these noises, whereby occurrence of loss and destruction of the device due to the malfunction can be prevented.

Next, first to fourth variations according to the present embodiment will be described. Those variations can achieve the above effects.

(First Variation)

Figure 4:
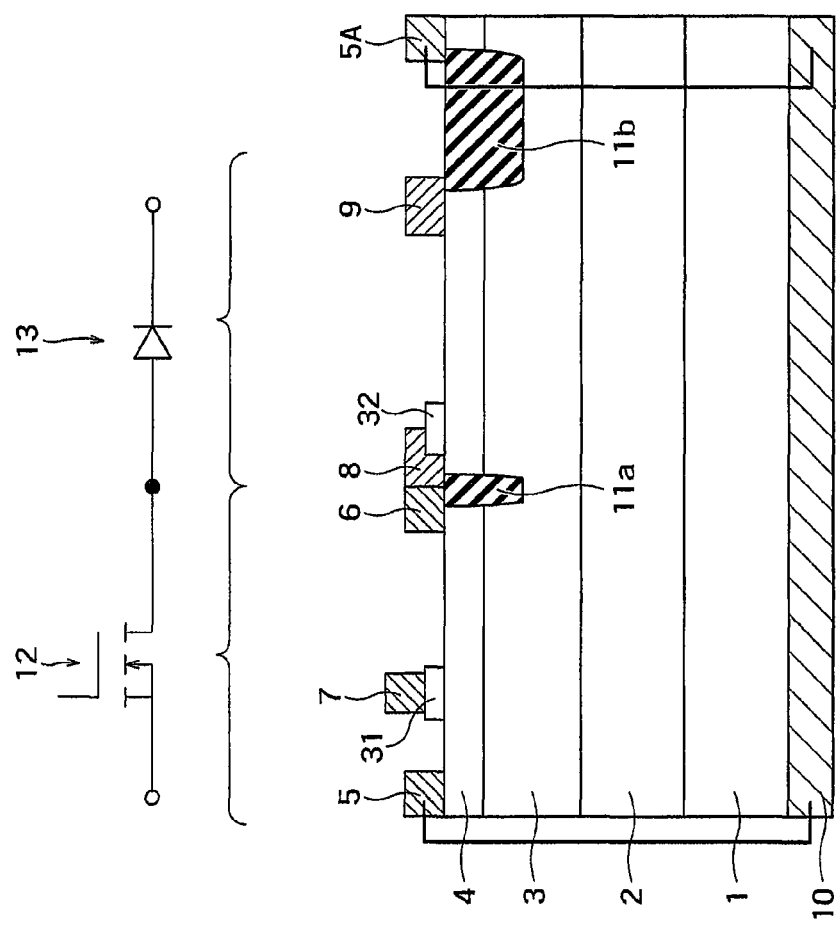
FIG. 4 is a schematic cross-sectional view of a nitride semiconductor device according to a first variation of the first embodiment of the present invention.

FIG. 4 shows a schematic cross-sectional view of a nitride semiconductor device according to the first variation. As shown in FIG. 4, in this variation, a p-type gate layer 31 formed of p-type $Al_ZGa_{1-Z}N$ ($0 \leq Z \leq 1$) is interposed between the gate electrode 7 and the nitride semiconductor layer 4. According to this constitution, an interface between the p-type gate layer 31 and the nitride semiconductor layer 4 is depleted by a built-in potential, and the HFET 12 can be made to be of a normally-off type.

In this variation, as shown in FIG. 4, a p-type anode layer 32 formed of p-type $Al_ZGa_{1-Z}N$ ($0 \leq Z \leq 1$) is interposed between a portion of the anode electrode 8 and the nitride semiconductor layer 4. According to this constitution, when an overcurrent should be flowed into the SBD 13, holes are injected from the p-type anode layer 32, whereby a rapid increase of an on-voltage can be prevented. Even if a reverse voltage is applied to the SBD 13 to cause avalanche breakdown, the holes are immediately discharged from the p-type anode layer 32, and therefore, high avalanche resistance can be obtained. The p-type anode layer 32 can be formed simultaneously with the p-type gate layer 31.

(Second Variation)

Figure 5:
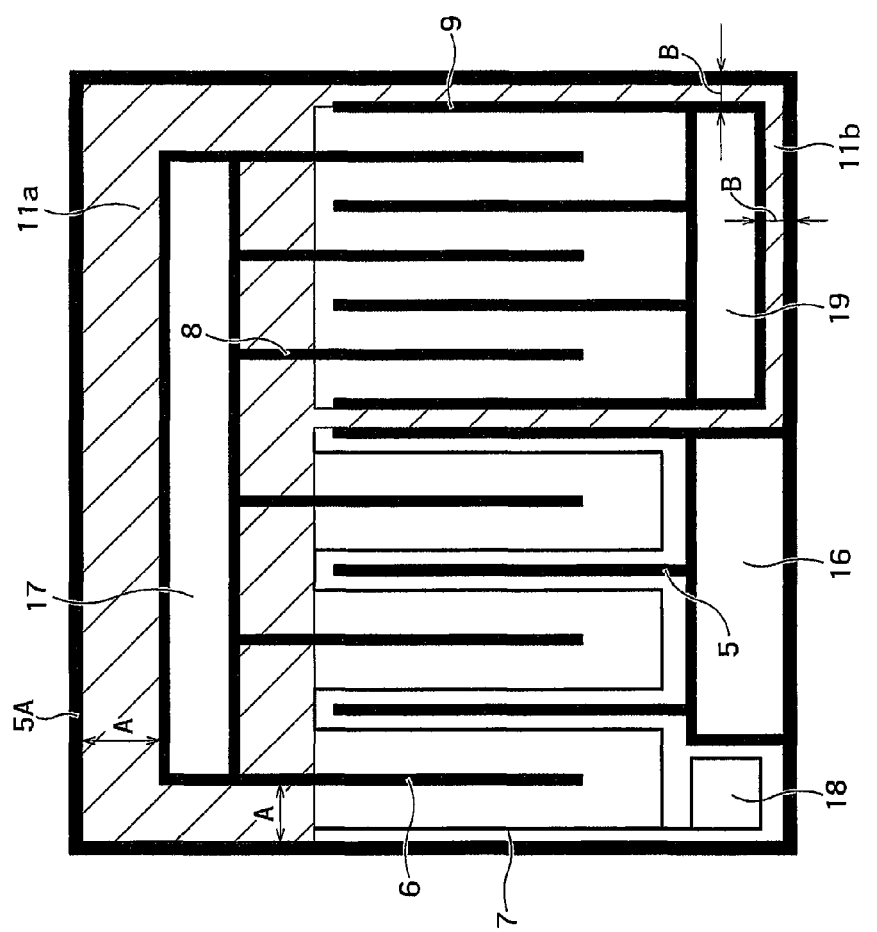
FIG. 5 is a plan view showing arrangement of electrodes of a nitride semiconductor device according to a second variation of the first embodiment of the present invention.

FIG. 5 shows a plan view showing arrangement of electrodes of a nitride semiconductor device according to a second variation. As shown in FIG. 5, in this variation, a distance A between the frame electrode 5A and the drain electrode 6 (the drain electrode/anode electrode pad 17) is longer than a distance B between the frame electrode 5A and the cathode electrode 9 (the cathode electrode pad 19).

In the boost chopper circuit, the electric potential at a connection point between the drain electrode 6 and the anode electrode 8 is changed by the switching operation of the HFET 12. When a parasitic capacitance between the drain electrode 6 and the frame electrode 5A is large, the switching operation is slowed down, and loss of a circuit is increased.

Thus, in this variation, the distance between the drain electrode 6 and the frame electrode 5A is made longer than the distance (B) between the frame electrode 5A and the cathode electrode 9. In other words, in an example of FIG. 5, the positions of various electrodes and electrode pads arranged in the frame electrode 5A having a predetermined size are approached in a right lower direction with respect to the frame electrode 5A. According to this constitution, the parasitic capacitance between the drain electrode 6 and the frame electrode 5A is reduced. Consequently, the high-speed switching operation is facilitated, and loss of the power converter circuit can be reduced.

(Third Variation)

Figure 6:
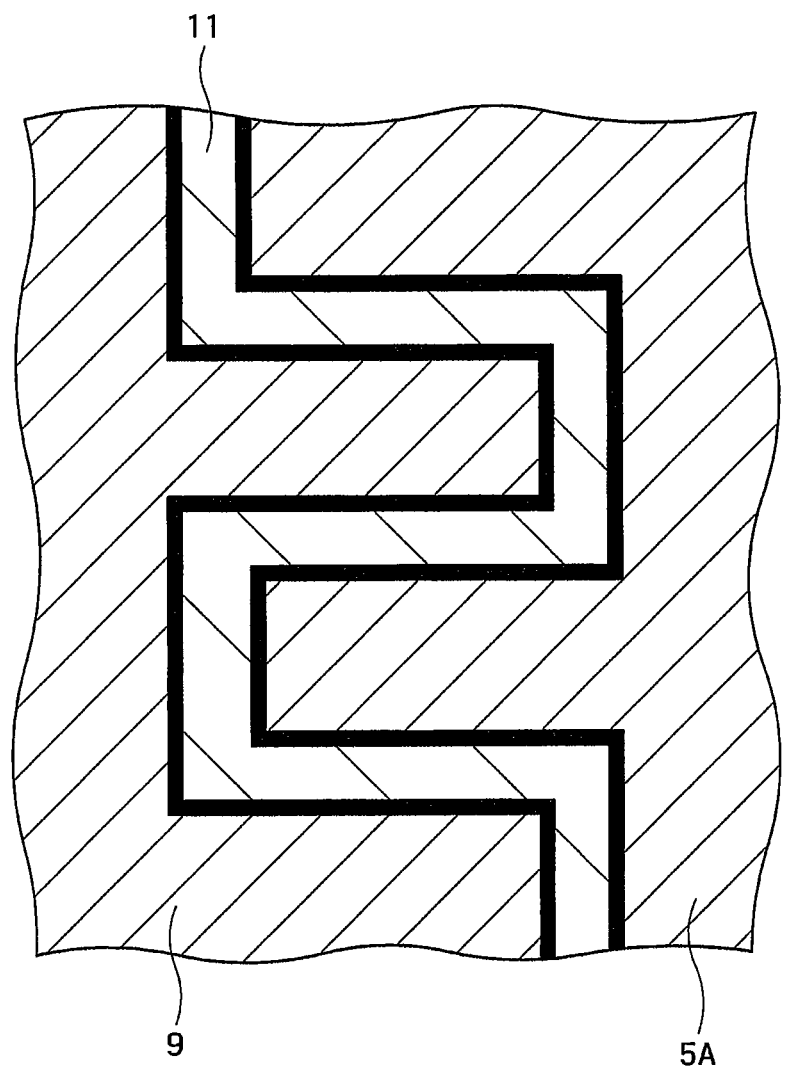
FIG. 6 is an enlarged plan view of a nitride semiconductor device according to a third variation of the first embodiment of the present invention.

FIG. 6 shows an enlarged plan view of a nitride semiconductor device according to a third variation.

As shown in FIG. 6, in this variation, the frame electrode 5A and the cathode electrode 9 facing each other have edges which are shaped so that a staggered gap is formed between the electrodes 5A and 9. The element isolation insulating layer 11b is exposed from the staggered gap.

Consequently, the facing area between the frame electrode 5A and the cathode electrode 9 is increased, and the parasitic capacitance is generated between the electrodes 5A and 9. The parasitic capacitance can be functioned as a smoothing capacitor 14b connected between the cathode electrode 9 and the source electrode 5 being the output side of the boost chopper circuit described in FIG. 3.

Thus, according to this variation, the capacitor 14b can be integrated with the nitride semiconductor device.

(Fourth Variation)

Figure 7:
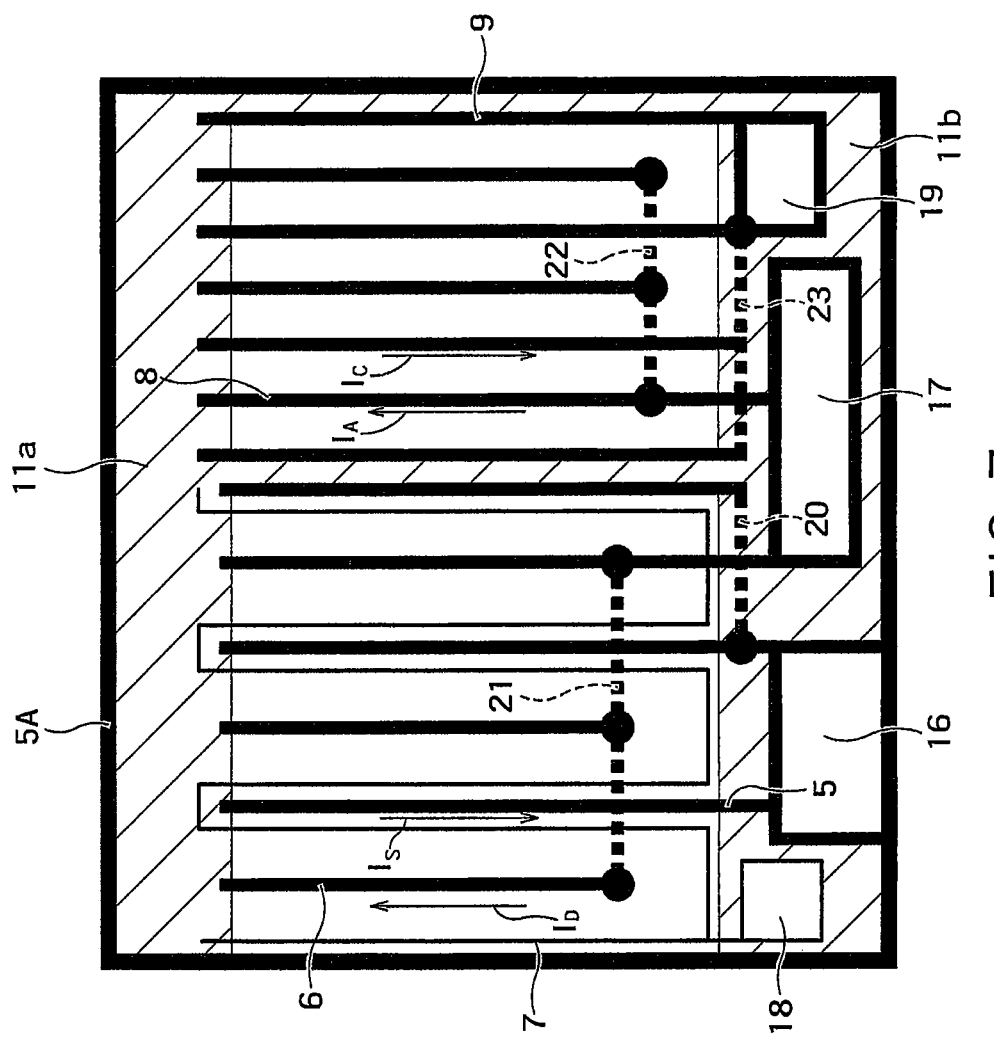
FIG. 7 is a plan view showing arrangement of electrodes of a nitride semiconductor device according to a fourth variation of the first embodiment of the present invention.

FIG. 7 is a plan view showing arrangement of electrodes of a nitride semiconductor device according to the fourth variation. As shown in FIG. 7, in this variation, the drain electrode/anode electrode pad 17, the source electrode pad 16, and the cathode electrode pad 19 are arranged on the side of the same side of the frame electrode 5A (the lower side in the example of FIG. 7).

As shown in FIG. 7, one end of the source electrode 5 is connected directly to the source electrode pad 16 or connected to the source electrode pad 16 through a source line 20. One end of the drain electrode 6 is connected directly to the drain electrode/anode electrode pad 17 or connected to the drain electrode/anode electrode pad 17 through a drain line 21. One end of the anode electrode 8 is connected directly to the drain electrode/anode electrode pad 17 or connected to the drain electrode/anode electrode pad 17 through an anode line 22. One end of the cathode electrode 9 is connected directly to the cathode electrode pad 19 or connected to the cathode electrode pad 19 through a cathode line 23.

The source line 20 is provided in a layer different from the layer in which the source electrode 5 is provided. The drain line 21 is provided in a layer different from the layer in which the drain electrode 6 is provided. The anode line 22 is provided in a layer different from the layer in which the anode electrode 8 is provided. The cathode line 23 is provided in a layer different from the layer in which the cathode electrode 9 is provided. Those lines are formed using a multilayer wiring technique.

In this variation, the drain electrode/anode electrode pad 17, the source electrode pad 16, and the cathode electrode pad 19 are arranged on the side of the same side of the frame electrode 5A to reverse the direction of a current $I_S$ flowing through the source electrode 5 and the direction of a current $I_D$ flowing through the drain electrode 6. Further, the direction of a current $I_A$ flowing through the anode electrode 8 and the direction of a current $I_C$ flowing through the cathode electrode 9 are reversed. Consequently, the inductance of the source electrode 5 and the drain electrode 6 is cancelled, and similarly, the inductance of the anode electrode 8 and the cathode electrode 9 is cancelled. As a result, the generation of switching noise can be further suppressed, and the high-speed switching operation can be realized.

(Second Embodiment)

Figure 8:
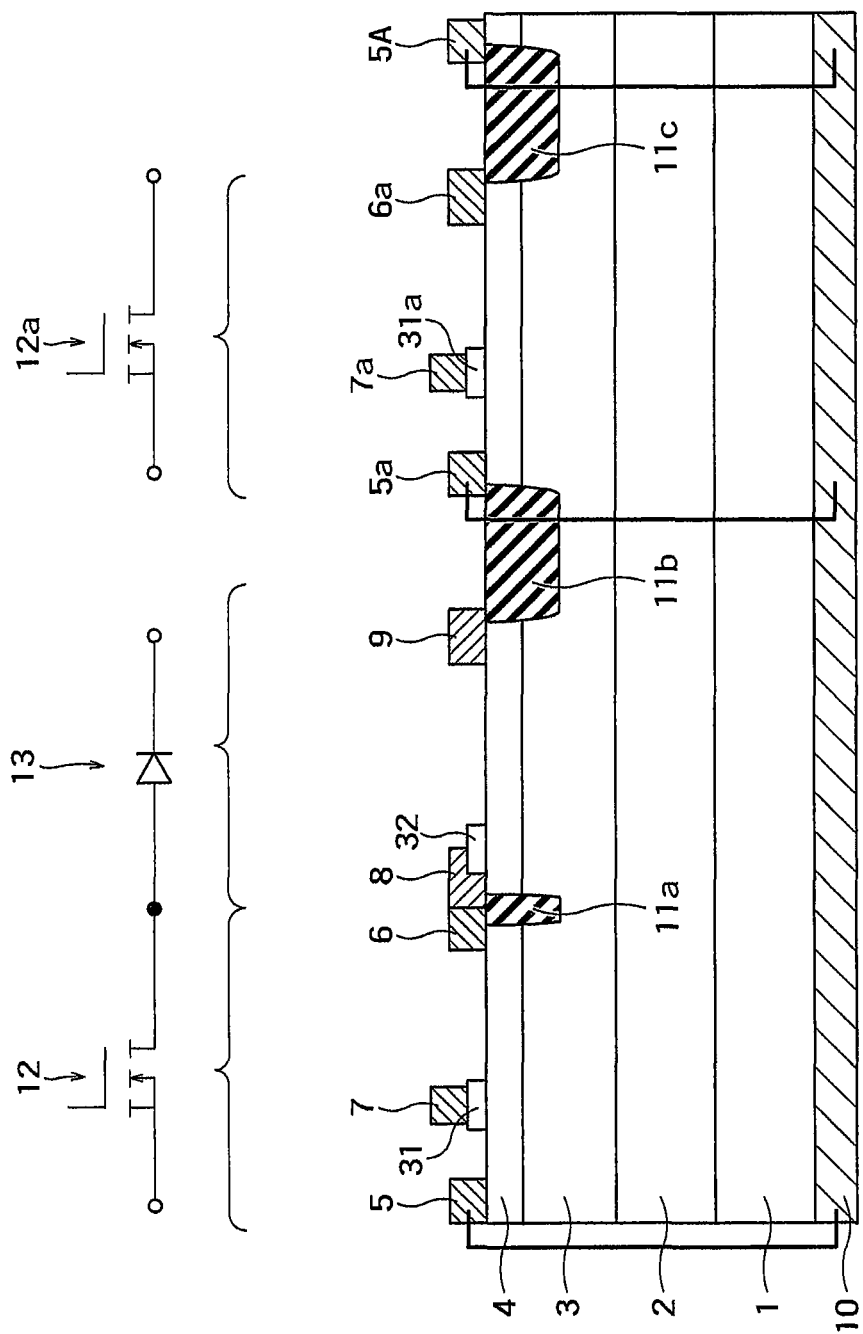
FIG. 8 is a schematic cross-sectional view of a nitride semiconductor device according to a second embodiment of the present invention.
Figure 9:
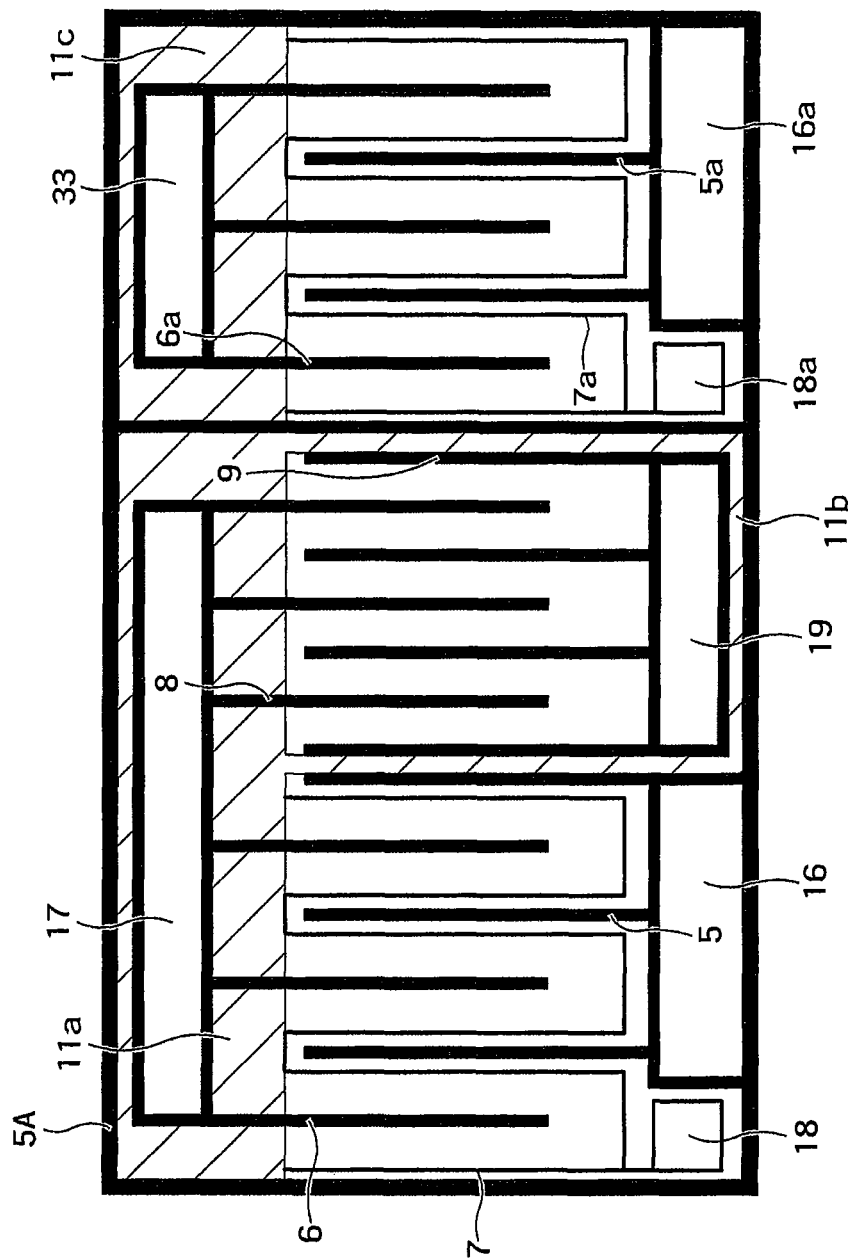
FIG. 9 is a plan view showing arrangement of electrodes of the nitride semiconductor device according to the second embodiment of the present invention.

Next, a nitride semiconductor device according a second embodiment of the present invention will be described with reference to FIGS. 8 and 9. FIG. 8 is a schematic cross-sectional view of the nitride semiconductor device according to the second embodiment. FIG. 9 is a plan view showing arrangement of electrodes of the nitride semiconductor device.

As one of differences between the second embodiment and the first embodiment, a second HFET is provided in the second embodiment. In the following description of the present embodiment, the same components as those in the first embodiment are assigned the same reference numerals, and descriptions thereof will not be repeated.

As shown in FIG. 8, the nitride semiconductor device according to the present embodiment is further provided with an HFET 12a provided adjacent to an HFET 12 and a SBD 13. The HFET 12a has a constitution similar to that of the HFET 12 and has a source electrode 5a, a drain electrode 6a, and a gate electrode 7a.

Both of the source electrode 5a and the drain electrode 6a are provided on a nitride semiconductor layer 4 and form an ohmic connection with the nitride semiconductor layer 4.

The gate electrode 7a is provided on a p-type gate layer 31a formed on the nitride semiconductor layer 4. The p-type gate layer 31a is formed of p-type $Al_ZGa_{1-Z}N$ (0≤Z≤1) as in the p-type gate layer 31 previously described. The gate electrode 7a may form a Schottky connection with the nitride semiconductor layer 4 not through the p-type gate layer 31a.

As shown in FIG. 9, the source electrode 5a of the HFET 12a is electrically connected to the source electrode 5 of the HFET 12 through a source electrode pad 16a and a frame electrode 5A. The source electrode 5a is insulated and isolated from the SBD 13 by element isolation insulating layers 11a and 11b.

As shown in FIG. 9, the frame electrode 5A surrounds the outer peripheries of the HFET 12 and the SBD 13 as well as the outer periphery of the HFET 12a. The frame electrode 5A is electrically connected to the source electrode 5a of the HFET 12a through the source electrode pad 16a.

One end of the source electrode 5a is electrically connected to the source electrode pad 16a. Meanwhile, one end of the drain electrode 6a is electrically connected to a drain electrode pad 33, and one end of the gate electrode 7a is electrically connected to a gate electrode pad 18a.

An element isolation insulating layer 11c is provided in a region including the drain electrode pad 33 and insulates the drain electrode pad 33 and the frame electrode 5A.

Figure 10:
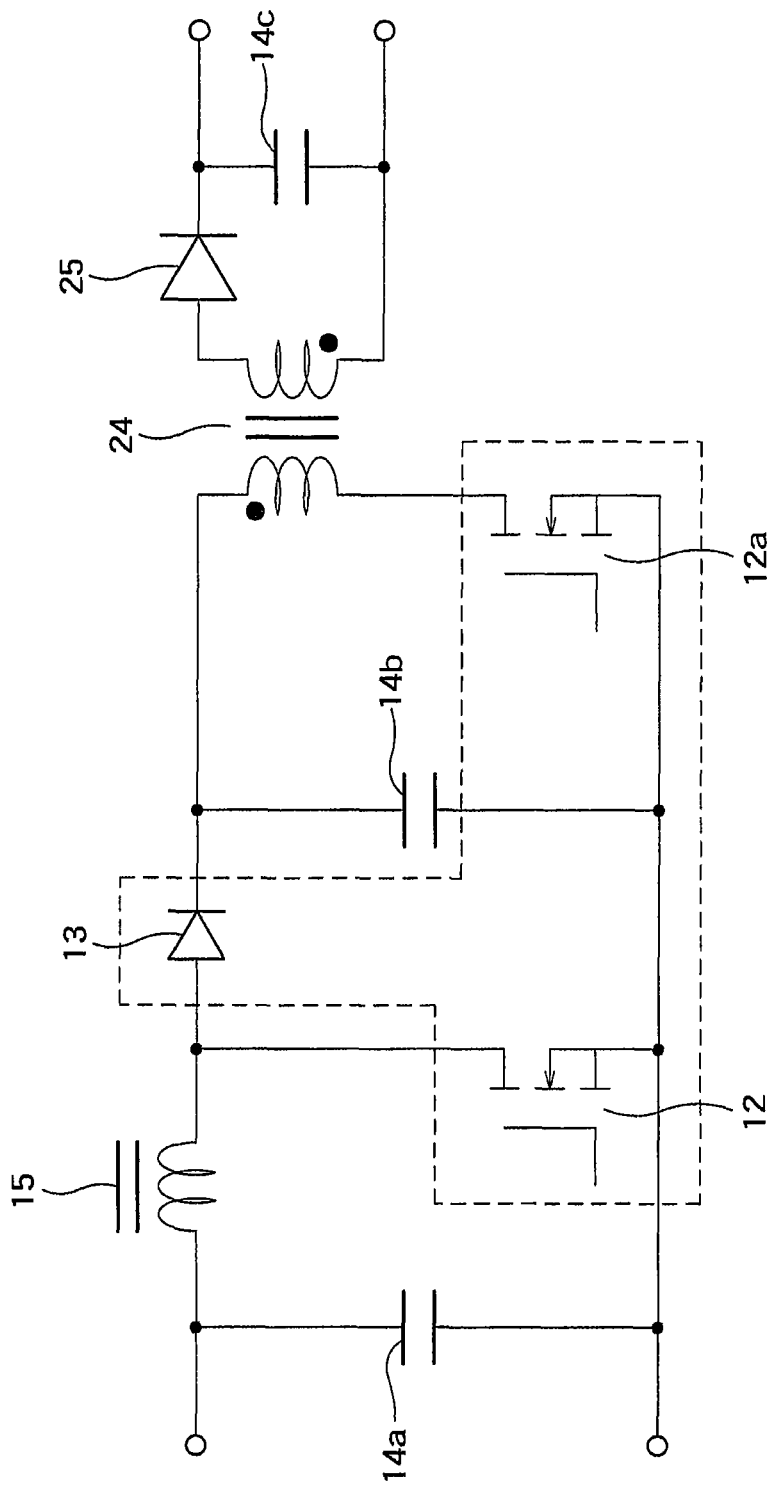
FIG. 10 is a circuit diagram of a flyback converter including the nitride semiconductor device according to the second embodiment of the present invention.

By virtue of the use of the nitride semiconductor device according to the present embodiment, a flyback converter circuit shown in FIG. 10 can be formed. The flyback converter circuit includes the HFET 12, the SBD 13 connected in series to the HFET 12, capacitors 14a and 14b, a choke coil 15, a transformer 24, the HFET 12a connected to a primary side of the transformer 24, an SBD 25 connected to a secondary side of the transformer 24, and a capacitor 14c. A portion surrounded by a dashed line in FIG. 10 is a portion which can be formed of the nitride semiconductor device according to the present embodiment.

As described above, in the present embodiment, the HFET 12a having the source electrode 5a electrically connected to the source electrode 5 of the HFET 12 is further provided in addition to the constitution of the first embodiment. The frame electrode 5A electrically connected to an electroconductive substrate 1 is provided so as to surround the outer peripheries of the HFET 12 and the SBD 13 as well as the outer periphery of the HFET 12a. According to this constitution, the generation of switching noise in the HFETs 12 and 12a can be suppressed as much as possible, and, at the same time, the influence of noise from outside can be blocked. Accordingly, a low-loss flyback converter circuit enabling high-frequency operation can be provided.

(Third Embodiment)

Figure 11:
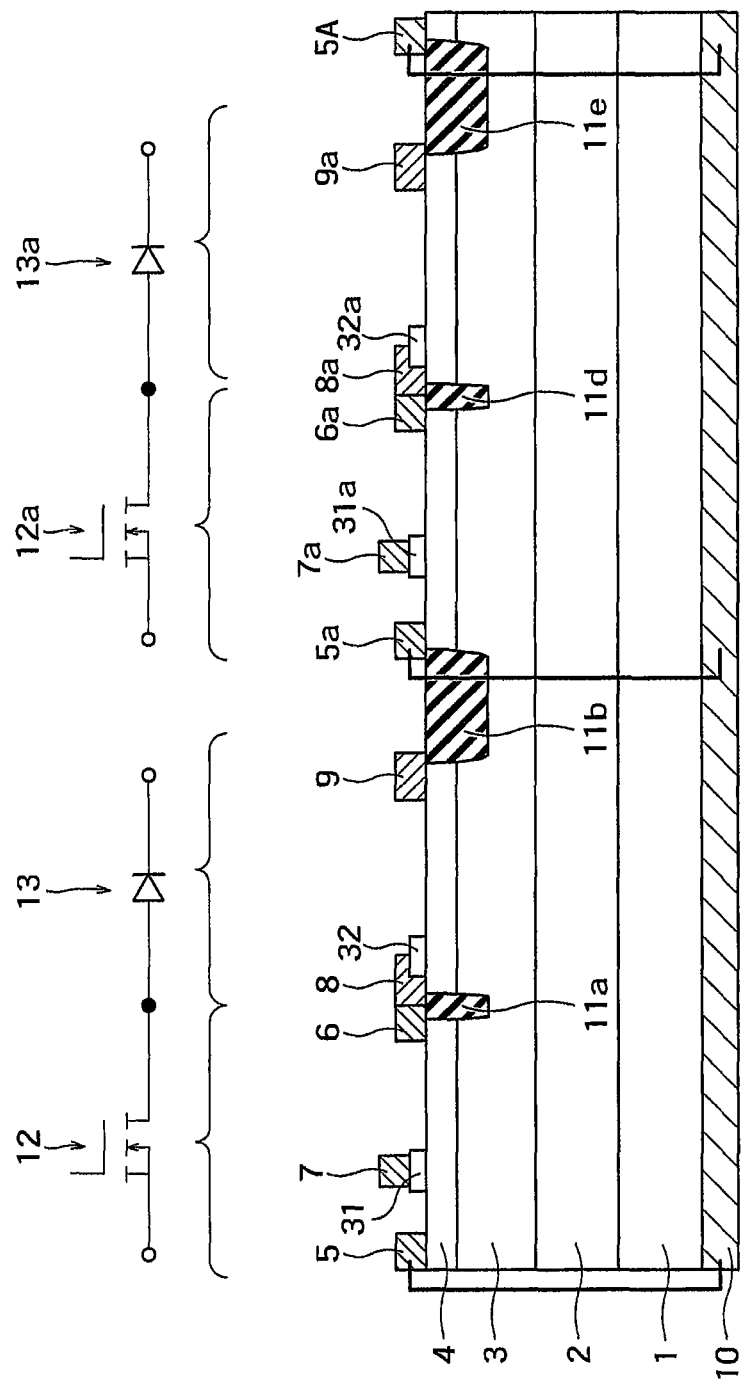
FIG. 11 is a schematic cross-sectional view of a nitride semiconductor device according to a third embodiment of the present invention.
Figure 12:
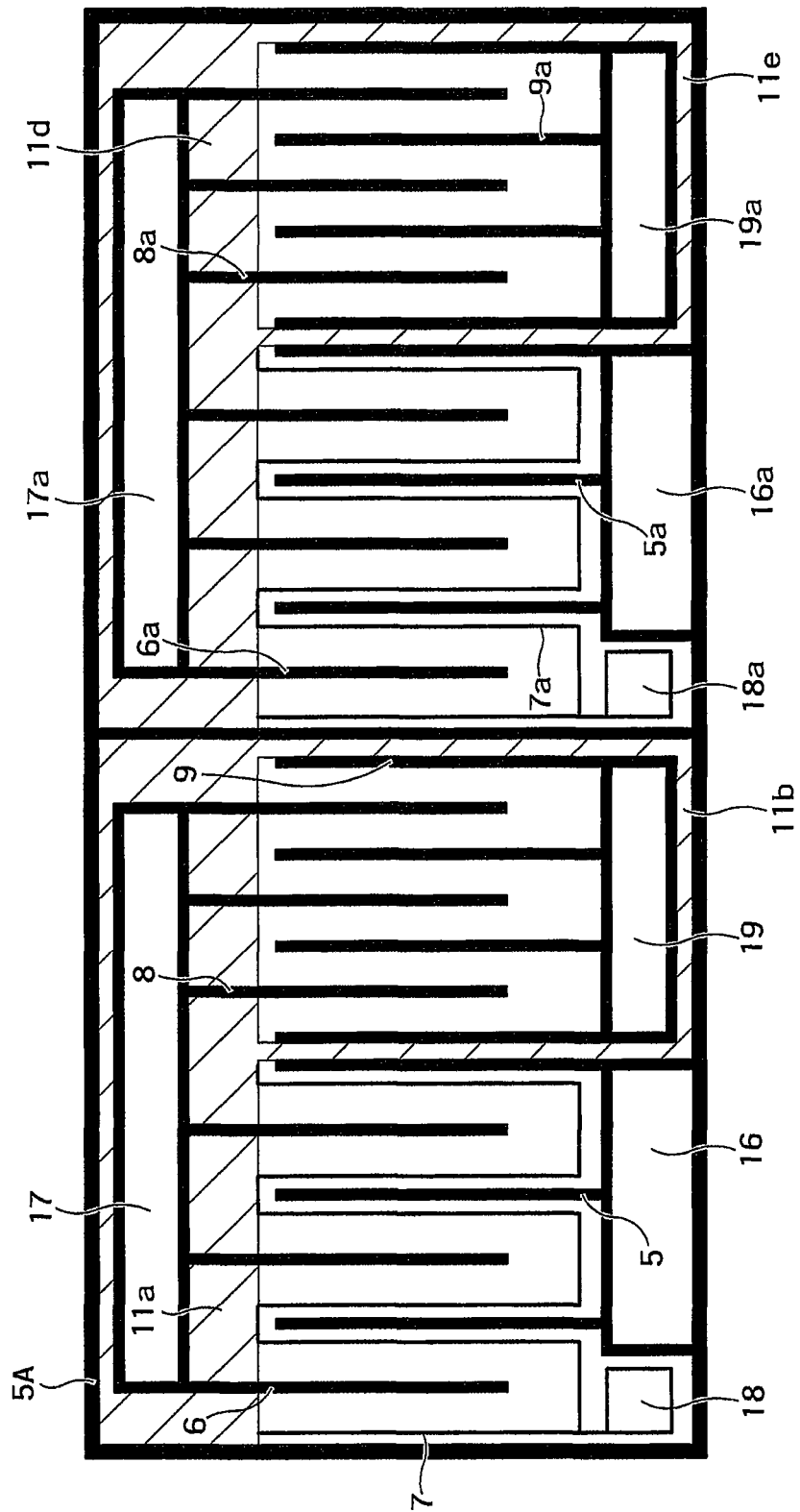
FIG. 12 is a plan view showing arrangement of electrodes of a nitride semiconductor device according to the third embodiment of the present invention.

Next, a nitride semiconductor device according to a third embodiment of the present invention will be described with reference to FIGS. 11 and 12. FIG. 11 is a schematic cross-sectional view of the nitride semiconductor device according to the third embodiment. FIG. 12 is a plan view showing arrangement of electrodes of the nitride semiconductor device.

As one of differences between the third embodiment and the first embodiment, a second HFET and a second SBD connected in series are provided in the third embodiment. In the following description of the present embodiment, the same components as those in the first and second embodiments are assigned the same reference numerals, and descriptions thereof will not be repeated.

As shown in FIG. 11, the nitride semiconductor device according to the present embodiment is further provided with an HFET 12a and an SBD 13a provided adjacent to an HFET 12 and a SBD 13. The HFET 12a has a constitution similar to that of the HFET 12, and has a source electrode 5a, a drain electrode 6a, and a gate electrode 7a. The SBD 13a has a constitution similar to that of the SBD 13, and has an anode electrode 8a and a cathode electrode 9a.

The anode electrode 8a is provided on a nitride semiconductor layer 4 and forms a Schottky connection with the nitride semiconductor layer 4. The anode electrode 8a is electrically connected to the drain electrode 6a of the drain electrode HFET 12a through a drain electrode/anode electrode pad 17a.

A cathode electrode 9a is provided on the nitride semiconductor layer 4 and forms an ohmic connection with the nitride semiconductor layer 4.

As in the first variation of the first embodiment described above, as shown in FIG. 11, a p-type anode layer 32a formed of p-type $Al_ZGa_{1-Z}N$ ($0 \leq Z \leq 1$) may be interposed between a portion of the anode electrode 8a and the nitride semiconductor layer 4.

As shown in FIG. 12, a frame electrode 5A surrounds the outer peripheries of the HFET 12 and the SBD 13 as well as the outer peripheries of the HFET 12a and the SBD 13a. The frame electrode 5A is electrically connected to the source electrode 5a of the HFET 12a through a source electrode pad 16a.

One end of the drain electrode 6a and one end of the anode electrode 8a are connected to the drain electrode/anode electrode pad 17a. One end of the cathode electrode 9a is connected to a cathode electrode pad 19a.

As seen in FIGS. 11 and 12, an element isolation insulating layer 11d is provided from the surface of the nitride semiconductor layer 4 to an intermediate portion of a nitride semiconductor layer 3 between the drain electrode 6a and the anode electrode 8a. The element isolation insulating layer 11d is provided in a region including the drain electrode/anode electrode pad 17a, whereby a reverse leakage current in the SBD 13a can be prevented.

As seen in FIGS. 11 and 12, an element isolation insulating layer 11e is provided from the surface of the nitride semiconductor layer 4 to an intermediate portion of the nitride semiconductor layer 3 between the source electrode 5a, the source electrode pad 16a and the frame electrode 5A, and the cathode electrode 9a and a cathode electrode pad 19.

Figure 13:
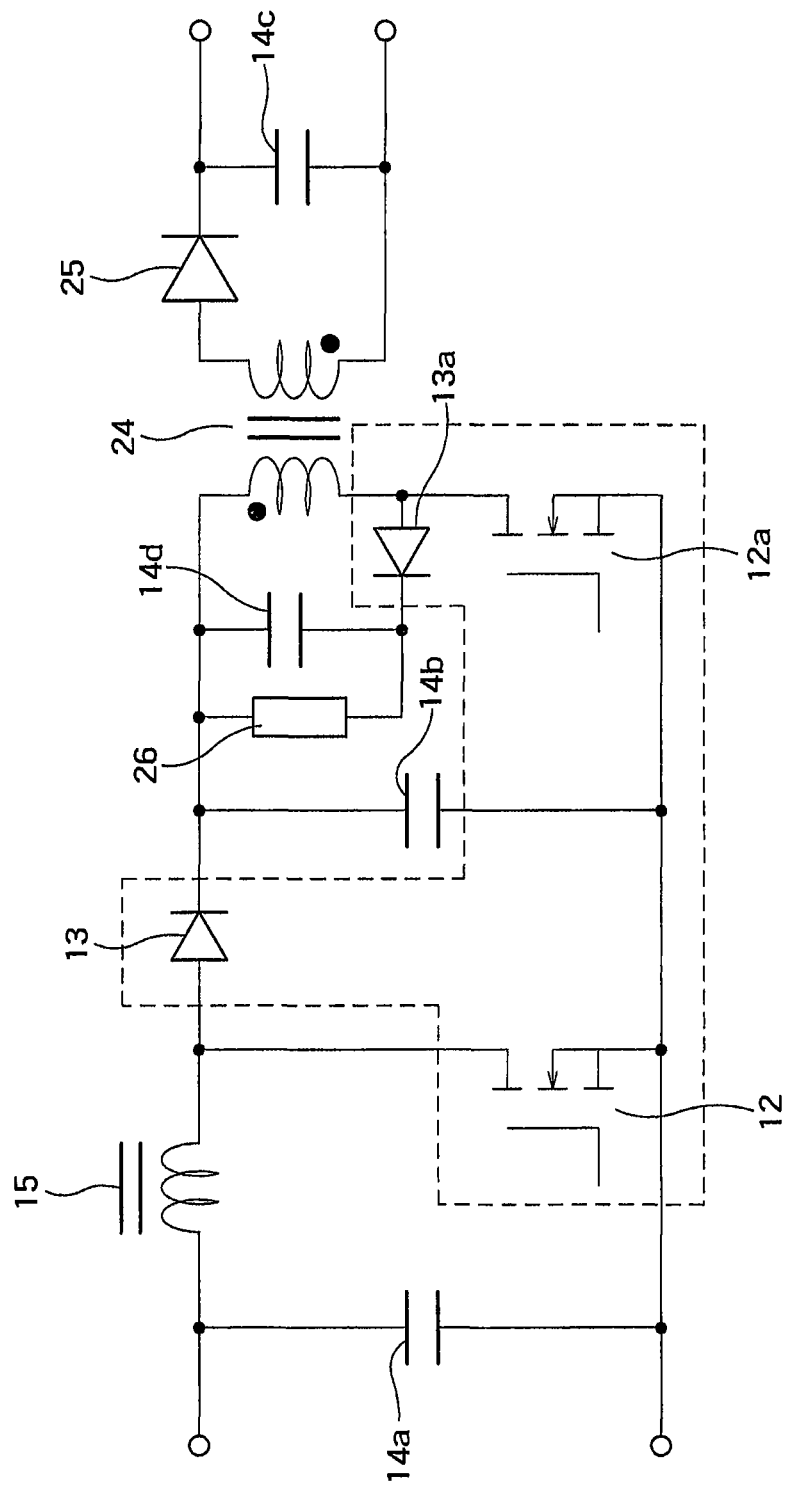
FIG. 13 is a circuit diagram of a forward converter including the nitride semiconductor device according to the third embodiment of the present invention.

By virtue of the use of the nitride semiconductor device according to the present embodiment, a forward converter circuit shown in FIG. 13 can be formed. The forward converter circuit includes the HFET 12, the SBD 13 connected in series to the HFET 12, capacitors 14a and 14b, a choke coil 15, a transformer 24, the HFET 12a connected to a primary side of the transformer 24, an SBD 25 connected to a secondary side of the transformer 24, a capacitor 14c, the SBD 13a, a capacitor 14d, and a resistance 26. A portion surrounded by a dashed line in FIG. 13 is a portion which can be formed of the nitride semiconductor device according to the present embodiment.

As described above, in the present embodiment, the HFET 12a and the SBD 13a connected in series are further provided in addition to the constitution of the first embodiment. The frame electrode 5A electrically connected to an electroconductive substrate 1 is provided so as to surround the outer peripheries of the HFET 12 and the SBD 13 as well as the outer peripheries of the HFET 12a and the SBD 13a. According to this constitution, the generation of switching noise in the HFETs 12 and 12a can be suppressed as much as possible, and, at the same time, the influence of noise from outside can be blocked. Accordingly, a low-loss forward converter circuit enabling high-frequency operation can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first nitride semiconductor layer;
   a second nitride semiconductor layer provided on the first nitride semiconductor layer and including a non-doped or n-type nitride semiconductor having a band gap wider than that of the first nitride semiconductor layer;
   a first heterojunction field effect transistor having a first source electrode provided on the second nitride semiconductor layer and forming an electric connection with the second nitride semiconductor layer, a first drain electrode provided on the second nitride semiconductor layer and forming an electric connection with the second nitride semiconductor layer, and a first gate electrode provided between the first source electrode and the first drain electrode;
   a first Schottky barrier diode having a first anode electrode provided on the second nitride semiconductor layer, forming an electric connection with the second nitride semiconductor layer, and electrically connected to the first drain electrode, and having a first cathode electrode provided on the second nitride semiconductor layer and forming an electric connection with the second nitride semiconductor layer;
   a first element isolation insulating layer having a first end contacting with the first drain electrode and the first anode electrode, and a second end located in the first nitride semiconductor layer; and
   a second element isolation insulating layer having a third end contacting with the first cathode electrode, and a fourth end located in the first nitride semiconductor layer.

2. The semiconductor device according to claim 1, further comprising a frame electrode electrically connected to the first source electrode and an electroconductive substrate and surrounding outer peripheries of the first heterojunction field effect transistor and the first Schottky barrier diode,
   wherein the first nitride semiconductor layer provided directly on the electroconductive substrate or provided on the electroconductive substrate through a buffer layer.

3. The semiconductor device according to claim 1,
   wherein the electric connection between the first source electrode and the second nitride semiconductor layer is an ohmic connection, and the electric connection between the first drain electrode and the second nitride semiconductor layer is an ohmic connection.

4. The semiconductor device according to claim 1,
   wherein the electric connection between the first anode electrode and the second nitride semiconductor layer is a Schottky connection.

5. The semiconductor device according to claim 1, wherein the first gate electrode is provided on the second nitride semiconductor layer and forms a Schottky connection with the second nitride semiconductor layer.

6. The semiconductor device according to claim 1, wherein a plurality of the first source electrodes and a plurality of the first drain electrodes are alternately provided along a predetermined direction, one end of each of the first source electrodes is connected to a source electrode pad, and one end of each of the first drain electrodes is connected to a drain electrode/anode electrode pad,
 a plurality of the first anode electrodes and a plurality of the first cathode electrodes are alternately provided along a predetermined direction, one end of each of the first anode electrodes is connected to the drain electrode/anode electrode pad, and one end of each of the first cathode electrodes is connected to a cathode electrode pad.

7. The semiconductor device according to claim 2, further comprising a back surface electrode provided on the electroconductive substrate on the side opposite to the first nitride semiconductor layer,
 wherein the back surface electrode forms an ohmic connection with the electroconductive substrate and is connected to a package frame, and
 the frame electrode is connected to the package frame.

8. The semiconductor device according to claim 1, wherein a p-type gate layer including p-type $Al_ZGa_{1-Z}N$ ($0 \leq Z \leq 1$) is interposed between the first gate electrode and the second nitride semiconductor layer.

9. The semiconductor device according to claim 1, wherein a p-type anode layer including p-type $Al_ZGa_{1-Z}N$ ($0 \leq Z \leq 1$) is interposed between a portion of the first anode electrode and the second nitride semiconductor layer.

10. The semiconductor device according to claim 2, wherein a distance between the frame electrode and the first drain electrode is longer than a distance between the frame electrode and the first cathode electrode.

11. The semiconductor device according to claim 2, wherein the frame electrode and the first cathode electrode facing each other have edges which are shaped so that a staggered gap is formed between the electrodes.

12. The semiconductor device according to claim 2, wherein
 a plurality of the first source electrodes and a plurality of the first drain electrodes are alternately provided along a predetermined direction, one end of each of the first source electrodes is connected directly to a source electrode pad or connected to the source electrode pad through a source line provided in a layer different from the layer in which the first source electrode is provided, one end of each of the first drain electrodes is connected directly to a drain electrode/anode electrode pad or connected to the drain electrode/anode electrode pad through a drain line provided in a layer different from the layer in which the first drain electrode is provided,
 a plurality of the first anode electrodes and a plurality of the first cathode electrodes are alternately provided along a predetermined direction, one end of each of the first anode electrodes is connected directly to the drain electrode/anode electrode pad or connected to the drain electrode/anode electrode pad through an anode line provided in a layer different from the layer in which the first anode electrode is provided, one end of each of the first cathode electrodes is connected directly to a cathode electrode pad or connected to the cathode electrode pad through a cathode line provided in a layer different from the layer in which the first cathode electrode is provided, and
 the drain electrode/anode electrode pad, the source electrode pad, and the cathode electrode pad are arranged on the side of the same side of the frame electrode.

13. The semiconductor device according to claim 2, further comprising a second heterojunction field effect transistor,
 wherein the frame electrode surrounds an outer periphery of the second heterojunction field effect transistor and is electrically connected to a second source electrode of the second heterojunction field effect transistor.

14. The semiconductor device according to claim 13, wherein the second heterojunction field effect transistor has the second source electrode provided on the second nitride semiconductor layer and forming an ohmic connection with the second nitride semiconductor layer, a second drain electrode provided on the second nitride semiconductor layer and forming an ohmic connection with the second nitride semiconductor layer, and a second gate electrode provided between the second source electrode and the second drain electrode and controlling a concentration of a two-dimensional electron gas generated on an interface between the first nitride semiconductor layer and the second nitride semiconductor layer.

15. The semiconductor device according to claim 14, wherein the second gate electrode is provided on the second nitride semiconductor layer and forms a Schottky connection with the second nitride semiconductor layer.

16. The semiconductor device according to claim 14, wherein a p-type gate layer including p-type $Al_ZGa_{1-Z}N$ ($0 \leq Z \leq 1$) is interposed between the second gate electrode and the second nitride semiconductor layer.

17. The semiconductor device according to claim 2, further comprising:
 a second heterojunction field effect transistor; and
 a second Schottky barrier diode having a second anode electrode electrically connected to a second drain electrode of the second heterojunction field effect transistor,
 wherein the frame electrode surrounds outer peripheries of the second heterojunction field effect transistor and the second Schottky barrier diode and, is electrically connected to a second source electrode of the second heterojunction field effect transistor.

18. The semiconductor device according to claim 17, wherein the second heterojunction field effect transistor has the second source electrode provided on the second nitride semiconductor layer and forming an ohmic connection with the second nitride semiconductor layer, the second drain electrode provided on the second nitride semiconductor layer and forming an ohmic connection with the second nitride semiconductor layer, and a second gate electrode provided between the second source electrode and the second drain electrode and controlling a concentration of a two-dimensional electron gas generated on an interface between the first nitride semiconductor layer and the second nitride semiconductor layer.

19. The semiconductor device according to claim 17, wherein the second Schottky barrier diode has the second anode electrode provided on the second nitride semiconductor layer, forming a Schottky connection with the second nitride semiconductor layer, and electrically connected to the second drain electrode, and has a second cathode electrode provided on the second nitride semiconductor layer and forming an ohmic connection with the second nitride semiconductor layer.

20. The semiconductor device according to claim 17, wherein a p-type anode layer including p-type $Al_ZGa_{1-Z}N$ ($0 \leq Z \leq 1$) is interposed between a portion of the second anode electrode and the second nitride semiconductor layer.

* * * * *